(12) United States Patent
Lee

(10) Patent No.: US 11,309,286 B2
(45) Date of Patent: Apr. 19, 2022

(54) STACK PACKAGES INCLUDING A HYBRID WIRE BONDING STRUCTURE

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 181 days.

(21) Appl. No.: 16/590,724

(22) Filed: Oct. 2, 2019

(65) Prior Publication Data

US 2020/0286860 A1 Sep. 10, 2020

(30) Foreign Application Priority Data

Mar. 6, 2019 (KR) .......................... 10-2019-0025585

(51) Int. Cl.
- *H01L 23/00* (2006.01)
- *H01L 25/065* (2006.01)
- *H01L 25/00* (2006.01)

(52) U.S. Cl.
CPC .......... *H01L 25/0657* (2013.01); *H01L 24/08* (2013.01); *H01L 24/48* (2013.01); *H01L 24/80* (2013.01); *H01L 24/85* (2013.01); *H01L 25/50* (2013.01); *H01L 2224/08145* (2013.01); *H01L 2224/48148* (2013.01); *H01L 2224/48465* (2013.01); *H01L 2224/80895* (2013.01); *H01L 2224/80896* (2013.01); *H01L 2225/06506* (2013.01); *H01L 2225/06524* (2013.01); *H01L 2225/06562* (2013.01); *H01L 2924/3511* (2013.01)

(58) Field of Classification Search
CPC ............................................. H01L 2225/06562
See application file for complete search history.

(56) References Cited

U.S. PATENT DOCUMENTS

2020/0066682 A1* 2/2020 Kim ........................ H01L 24/05

FOREIGN PATENT DOCUMENTS

| KR | 1020140010554 A | 1/2014 |
| KR | 1020140028209 A | 3/2014 |

\* cited by examiner

*Primary Examiner* — Moazzam Hossain
*Assistant Examiner* — Hajar Kolahdouzan
(74) *Attorney, Agent, or Firm* — William Park & Associates Ltd.

(57) ABSTRACT

A stack package includes first and second sub-chip stacks stacked on a package substrate and bonding wires. The first sub-chip stack includes first and second sub-chips. The first sub-chip has a first surface on which a first common pad is disposed. The second sub-chip has a third surface on which a second common pad is disposed. The third surface is bonded to the first surface such that the second common pad is bonded to the first common pad. The second sub-chip includes a fourth surface opposite to the second common pad and a through hole extending from the fourth surface to reveal the second common pad. The bonding wire is connected to the second common pad via the through hole and electrically connects both of the first and second common pads to the package substrate.

15 Claims, 12 Drawing Sheets

STACK PACKAGES INCLUDING A HYBRID WIRE BONDING STRUCTURE

CROSS-REFERENCE TO RELATED APPLICATIONS

The present application claims priority under 35 U.S.C 119(a) to Korean Application No. 10-2019-0025585, filed on Mar. 6, 2019, which is incorporated herein by references in its entirety.

BACKGROUND

1. Technical Field

The present disclosure generally relates to semiconductor package technologies and, more particularly, to stack packages including a hybrid wire bonding structure.

2. Related Art

As mobile systems are increasingly in demand with the development of smaller electronic devices, high performance and large capacity of semiconductor packages have been continuously developed. For example, memory semiconductor packages have been developed to have a high density and a multichannel characteristic. That is, a lot of effort has been focused on increasing the number of semiconductor chips embedded in a single semiconductor package.

In order to increase the number of semiconductor chips embedded in a single semiconductor package, a technique for vertically stacking a plurality of semiconductor chips on a package substrate has been proposed to provide stack packages. In such a case, a wire bonding technique or a through silicon via (TSV) technique has been used to electrically connect the plurality of stacked semiconductor chips to the package substrate. Recently, various advanced techniques have been developed to improve interconnection structures for electrically connecting a plurality of stacked semiconductor chips to a package substrate.

SUMMARY

According to an embodiment, a stack package may include a first sub-chip stack, a second sub-chip stack and bonding wires. The first sub-chip stack may be disposed on a package substrate, and the second sub-chip stack may be stacked on the first sub-chip stack to be laterally offset relative to the first sub-chip stack. The bonding wires may electrically connect the first sub-chip stack to the package substrate. The first sub-chip stack may include a first sub-chip and a second sub-chip. The first sub-chip may have a first surface on which a first discrete pad and a first common pad are disposed. The second sub-chip may have a third surface bonded to the first surface. The second sub-chip may include a second discrete pad, a second common pad and through holes. The second discrete pad and the second common pad may be disposed on the third surface, and the through holes may extend from a fourth surface of the second sub-chip opposite to the first sub-chip to reveal the first discrete pad, the second discrete pad and the second common pad. The second common pad may be bonded to the first common pad. The bonding wires may be bonded to respective ones of the first discrete pad, the second discrete pad and the second common pad via the through holes.

According to another embodiment, a stack package may include a first sub-chip stack and a bonding wire. The first sub-chip stack is disposed on a package substrate, and the bonding wire may electrically connect the first sub-chip stack to the package substrate. The first sub-chip stack may include a first sub-chip and a second sub-chip. The first sub-chip may have a first surface on which a first common pad is disposed. The second sub-chip may have a third surface on which a second common pad is disposed, and the third surface may be bonded to the first surface such that the second common pad is bonded to the first common pad. The second sub-chip may include a fourth surface and a through hole. The fourth surface of the second sub-chip may be opposite to the second common pad, and the through hole may extend from the fourth surface to reveal the second common pad. The bonding wire may be connected to the second common pad via the through hole and may be configured to electrically connect both of the first and second common pads to the package substrate.

DETAILED DESCRIPTION

Figure 1:
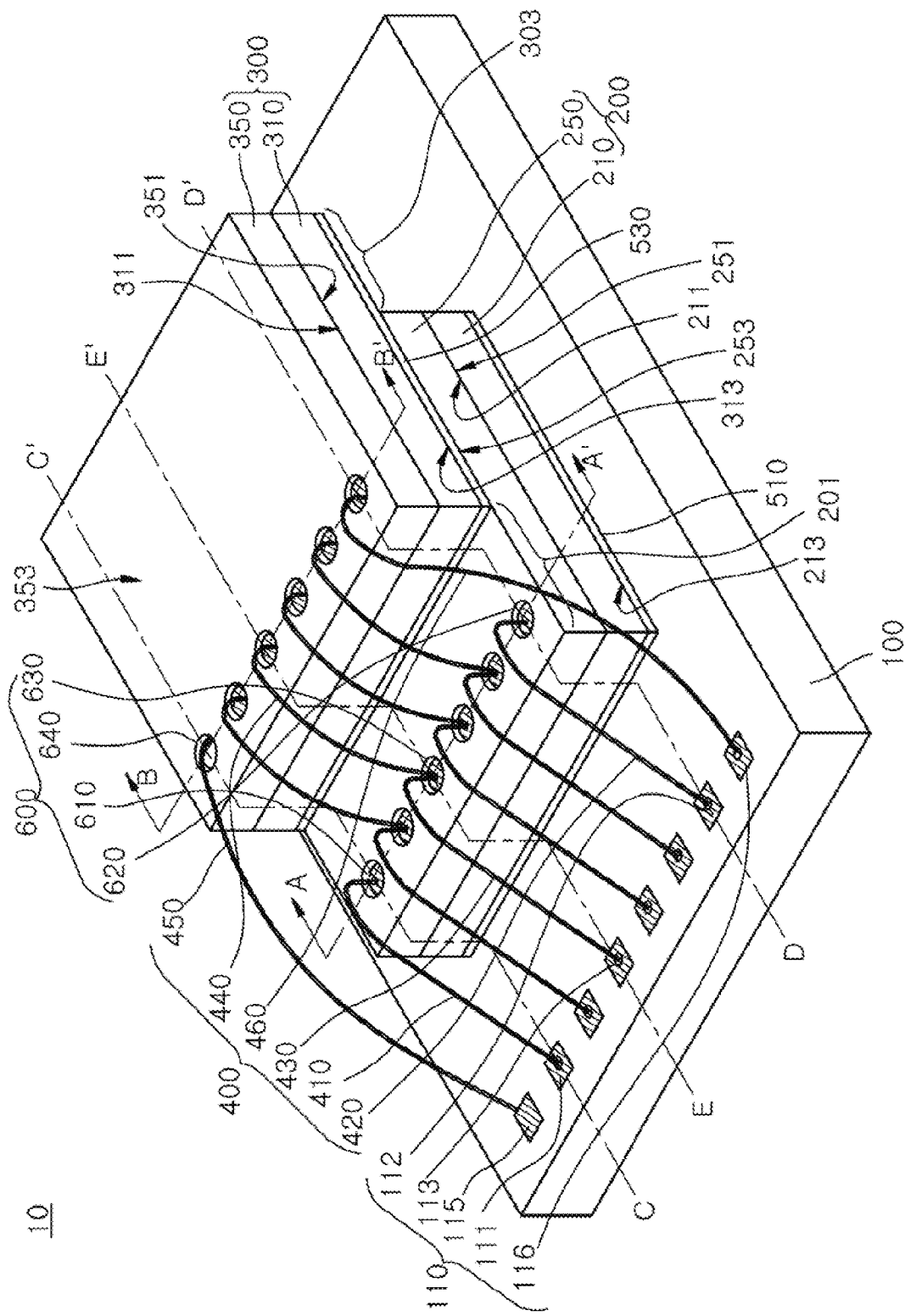
FIG. 1 is a perspective view illustrating a stack package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A stack package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a perspective view illustrating a stack package 10 according to an embodiment.

Referring to FIG. 1, the stack package 10 may be configured to include a package substrate 100, a first sub-chip stack 200, a second sub-chip stack 300 and bonding wires 400. Although not shown in the drawings, one of more additional sub-chip stacks may be stacked on the second sub-chip stack 300.

The first sub-chip stack 200 may be attacked to a top surface of the package substrate 100 using a first adhesive layer 510. The first adhesive layer 510 may fix the first sub-chip stack 200 to the package substrate 100. The package substrate 100 may act as an interconnection member that electrically connects the first and second sub-chip stack 200 and 300 to an external device (not shown). The package substrate 100 may be a substrate including a circuit interconnection structure, for example, a printed circuit board (PCB). The package substrate 100 may be an interposer or may include a dielectric layer in which redistributed lines (RDLs) are disposed.

The package substrate 100 may include bonding fingers 110 having a surface to which the bonding wires 400 are bonded. The bonding fingers 110 may correspond to a portion of a circuit interconnection structure (not shown) disposed in or on the package substrate 100. The bonding fingers 110 may be disposed on a portion of package substrate 100 to be spaced apart from the first and second sub-chip stacks 200 and 300. The first and second sub-chip stacks 200 and 300 may be disposed on the package substrate 100 to reveal the bonding fingers 110. This is because first ends of some of the bonding wires 400 should be bonded to the bonding fingers 110.

The second sub-chip stack 300 may be stacked on the first sub-chip stack 200 to be laterally offset relative to the first sub-chip stack 200. The second sub-chip stack 300 may be laterally offset relative to the first sub-chip stack 200 to reveal an edge portion 201 of the first sub-chip stack 200. Thus, an edge portion of the second sub-chip stack 300 may laterally protrude from a side surface of the first sub-chip stack 200 to act as a protrusive portion 303 corresponding to an overhang. The protrusive portion 303 of the second sub-chip stack 300 may be adjacent to a side surface of the first sub-chip stack 200 opposite to the edge portion 201 of the first sub-chip stack 200. As a result, the second sub-chip stack 300 may be laterally offset relative to the first sub-chip stack 200 to provide a step structure. The second sub-chip stack 300 may be attached to the first sub-chip stack 200 using a second adhesive layer 530.

Figure 2:
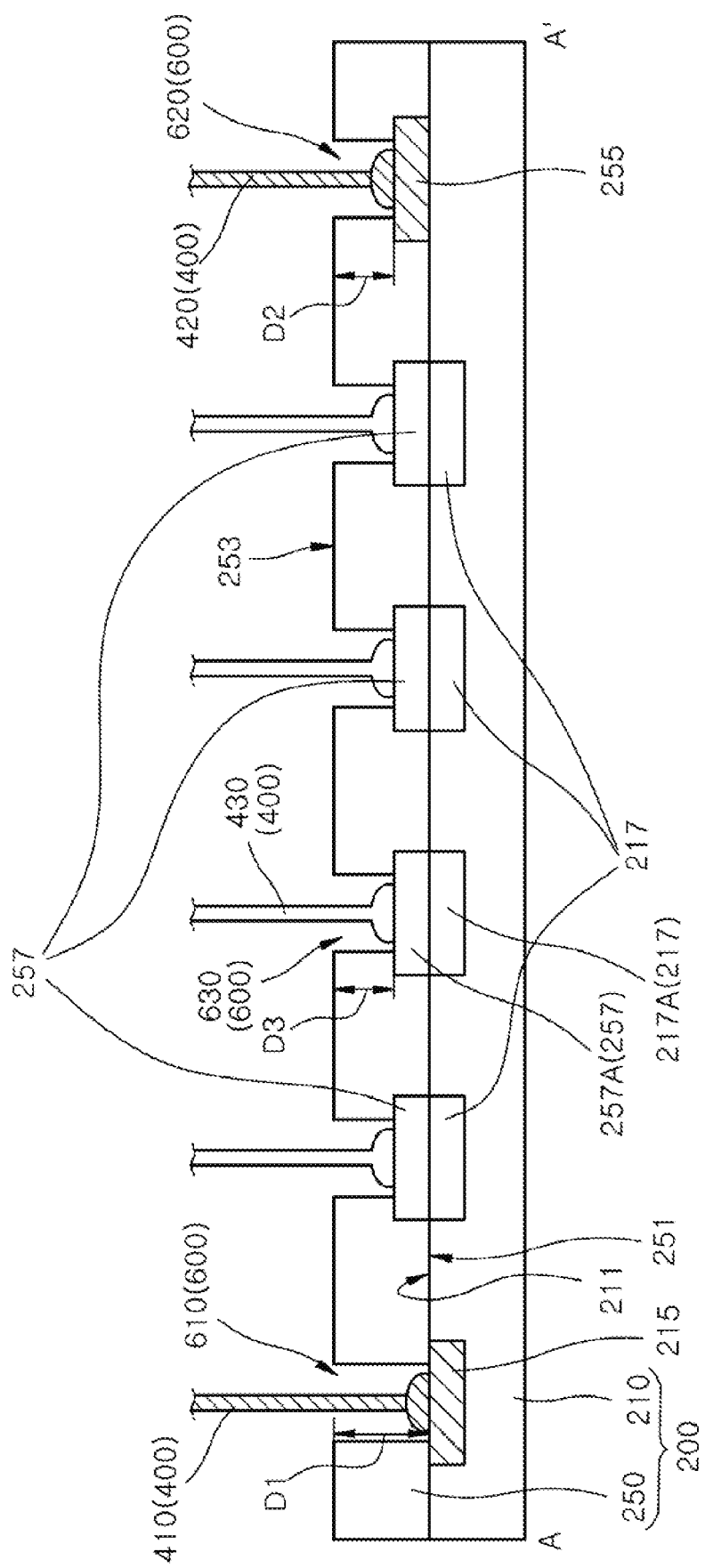
FIG. 2 is a cross-sectional view taken along a line A-A' of FIG. 1.

FIG. 2 is a cross-sectional view taken along a line A-A' crossing the first sub-chip stack 200 included in the stack package 10 of FIG. 1.

Referring to FIGS. 1 and 2, the first sub-chip stack 200 may be configured to include a first sub-chip 210 and a second sub-chip 250 which are bonded to each other. The first and second sub-chips 210 and 250 may be semiconductor chips having different functions. However, in some other embodiments, the first and second sub-chips 210 and 250 may be semiconductor chips having the same function. The first and second sub-chips 210 and 250 may be memory semiconductor chips such as NAND chips or DRAM chips.

The first and second sub-chips 210 and 250 may fully overlap with each other and may be bonded to each other. The second sub-chip 250 may fully overlap with the first sub-chip 210 such that side surfaces of the second sub-chip 250 are vertically aligned with side surfaces of the first sub-chip 210.

The first and second sub-chips 210 and 250 may be bonded to each other using a wafer bonding technique to constitute the first sub-chip stack 200. For example, the first and second sub-chips 210 and 250 may be bonded to each other using a direct bonding interconnection (DBI) technique to constitute the first sub-chip stack 200. No organic adhesive material or no organic adhesive layer may be provided at an interface between the first and second sub-chips 210 and 250.

A third surface 251 of the second sub-chip 250 may face a first surface 211 of the first sub-chip 210, and the third surface 251 of the second sub-chip 250 may be bonded to the first surface 211 of the first sub-chip 210. A second surface (213 of FIG. 1) of the first sub-chip 210 opposite to the second sub-chip 250 may face the package substrate 100, and the second surface (213 of FIG. 1) of the first sub-chip 210 may be attached to a surface of the package substrate 100 using the first adhesive layer 510. An integrated circuit (not shown) may be disposed in the first sub-chip 210 to be adjacent to the first surface 211 of the first sub-chip 210, and another integrated circuit (not shown) may be disposed in the second sub-chip 250 to be adjacent to the third surface 251 of the second sub-chip 250. The first and third surfaces 211 and 251 may correspond to active surfaces which are adjacent to the integrated circuits of the first and second sub-chips 210 and 250.

A first discrete pad 215 and first common pads 217 may be disposed on the first surface 211 of the first sub-chip 210. Although FIG. 2 illustrates an example in which the number of the first discrete pad 215 is one, the number of the first discrete pad 215 may be two or more according to the embodiments. The first discrete pad 215 and the first common pads 217 may act as connection terminals that electrically connect the first sub-chip 210 to the bonding wires 400.

A second discrete pad 255 and second common pads 257 may be disposed on the third surface 251 of the second sub-chip 250. Although FIG. 2 illustrates an example in which the number of the second discrete pad 255 is one, the number of the second discrete pad 255 may be two or more according to the embodiments. The second discrete pad 255 and the second common pads 257 may act as connection terminals that electrically connect the second sub-chip 250 to the bonding wires 400.

The first discrete pad 215 of the first sub-chip 210 may be disposed to be spaced apart from and distinct from the first common pads 217. The first discrete pad 215 may be disposed at an outside region of a region in which the first common pads 217 are disposed. The second discrete pad 255 of the second sub-chip 250 may be disposed to be spaced apart from and distinct from the second common pads 257. The second discrete pad 255 may be disposed at an outside region of a region in which the second common pads 257 are disposed.

The first common pads 217 of the first sub-chip 210 may be disposed to overlap with the second common pads 257 of the second sub-chip 250. The second sub-chip 250 may be bonded to the first sub-chip 210 such that the second common pads 257 of the second sub-chip 250 overlap with respective ones of the first common pads 217 of the first sub-chip 210. In an embodiment, the second common pads 257 of the second sub-chip 250 may overlap with the first common pads 217 of the first sub-chip 210 in a one-to-one manner whereby a single second common pad 257 overlaps with a single first common pad 217. A first common pad 217A corresponding to one of the first common pads 217 may be bonded to a second common pad 257A corresponding to one of the second common pads 257, and the first common pad 217A and the second common pad 257A may be electrically connected to each other to provide one signal path. The first common pads 217 of the first sub-chip 210 may be data input/output (I/O) terminals of the first sub-chip 210. The first common pads 257 of the second sub-chip 250 may be data input/output (I/O) terminals of the second sub-chip 250.

The first discrete pad 215 of the first sub-chip 210 may be disposed independently of a position of the second discrete pad 255 of the second sub-chip 250. The first discrete pad 215 of the first sub-chip 210 and the second discrete pad 255 of the second sub-chip 250 may be disposed to be spaced apart from each other without overlapping in a plan view. For example, the first discrete pad 215 of the first sub-chip 210 and the second discrete pad 255 of the second sub-chip 250 may be disposed to be spaced apart from each other to prevent the first and second discrete pads 215 and 255 from vertically overlapping each other. The first discrete pad 215 of the first sub-chip 210 may be located at one side of a region including the first common pads 217 (or the second common pads 257) opposite to the second discrete pad 255 of the second sub-chip 250 in a plan view. Accordingly, the first discrete pad 215 of the first sub-chip 210 and the second discrete pad 255 of the second sub-chip 250 are not bonded to each other to be electrically disconnected from each other.

The first discrete pad 215 of the first sub-chip 210 and the second discrete pad 255 of the second sub-chip 250 may be connection terminals which are electrically independent from each other. The first discrete pad 215 may be electrically connected to only the first sub-chip 210 and may be electrically disconnected from the second sub-chip 250. Similarly, the second discrete pad 255 may be electrically connected to only the second sub-chip 250 and may be electrically disconnected from the first sub-chip 210.

The first discrete pad 215 may be a connection terminal for selecting the first sub-chip 210 of the first and second sub-chips 210 250. For example, the first discrete pad 215 may be a first chip enable pad to which a chip enable signal for selectively driving the first sub-chip 210 is applied. Similarly, the second discrete pad 255 may be a second chip enable pad to which a chip enable signal for selectively driving the second sub-chip 250 is applied.

Figure 3:
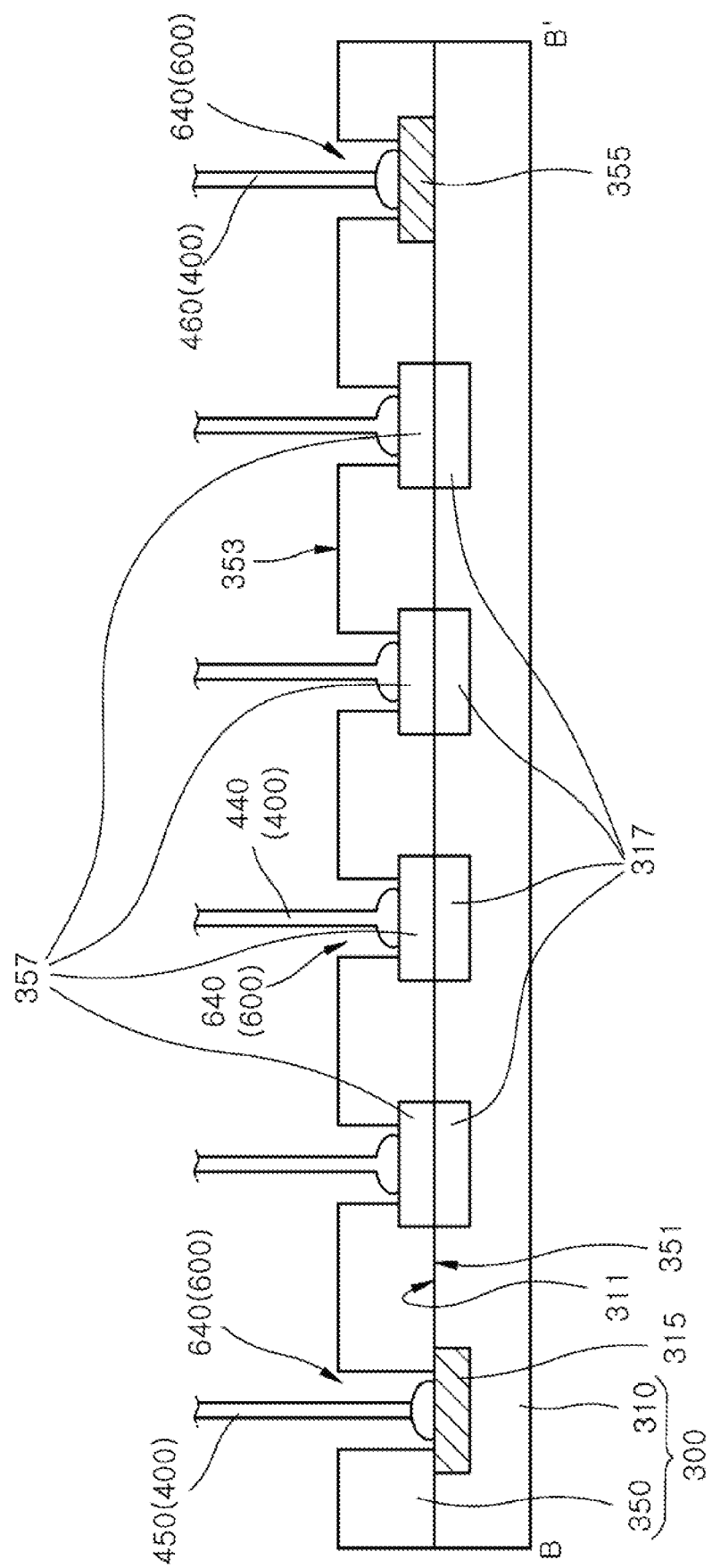
FIG. 3 is a cross-sectional view taken along a line B-B' of FIG. 1.

FIG. 3 is a cross-sectional view taken along a line B-B' crossing the second sub-chip stack 300 included in the stack package 10 of FIG. 1.

Referring to FIGS. 1 and 3, the second sub-chip stack 300 may have substantially the same shape as the first sub-chip stack 200. The second sub-chip stack 300 may be configured to include a third sub-chip 310 and a fourth sub-chip 350 which are bonded to each other. The third and fourth sub-chips 310 and 350 may fully overlap with each other and may be bonded to each other. The fourth sub-chip 350 may fully overlap with the third sub-chip 310 such that side surfaces of the fourth sub-chip 350 are vertically aligned with side surfaces of the third sub-chip 310.

The third and fourth sub-chips 310 and 350 may be bonded to each other using a wafer bonding technique to constitute the second sub-chip stack 300. For example, the third and fourth sub-chips 310 and 350 may be bonded to each other using a direct bonding interconnection (DBI) technique to constitute the second sub-chip stack 300. No organic adhesive material or no organic adhesive layer may be provided at an interface between the third and fourth sub-chips 310 and 350.

A seventh surface 351 of the fourth sub-chip 350 may face a fifth surface 311 of the third sub-chip 310, and the seventh surface 351 of the fourth sub-chip 350 may be bonded to the fifth surface 311 of the third sub-chip 310. A sixth surface (313 of FIG. 1) of the third sub-chip 310 opposite to the fourth sub-chip 350 may face a fourth surface 253 of the second sub-chip 250, and the sixth surface (313 of FIG. 1) of the third sub-chip 310 may be attached to the fourth surface 253 of the second sub-chip 250 using the second adhesive layer 530.

A third discrete pad 315 and third common pads 317 may be disposed on the fifth surface 311 of the third sub-chip 310. The third discrete pad 315 and the third common pads 317 may act as connection terminals that electrically connect the third sub-chip 310 to the bonding wires 400. A fourth discrete pad 355 and fourth common pads 357 may be disposed on the seventh surface 351 of the fourth sub-chip 350. The fourth discrete pad 355 and the fourth common pads 357 may act as connection terminals that electrically connect the fourth sub-chip 350 to the bonding wires 400.

The third discrete pad 315 of the third sub-chip 310 may be disposed to be spaced apart from and distinct from the third common pads 317. The third discrete pad 315 may be disposed at an outside region of a region in which the third common pads 317 are disposed. The fourth discrete pad 355 of the fourth sub-chip 350 may be disposed to be spaced apart from and distinct from the fourth common pads 357. The fourth discrete pad 355 may be disposed at an outside region of a region in which the fourth common pads 357 are disposed.

The third common pads 317 of the third sub-chip 310 may be disposed to overlap with the fourth common pads 357 of the fourth sub-chip 350. The fourth sub-chip 350 may be bonded to the third sub-chip 310 such that the fourth common pads 357 of the fourth sub-chip 350 overlap with respective ones of the third common pads 317 of the third sub-chip 310. In an embodiment, the fourth common pads 357 of the fourth sub-chip 350 may overlap with the third common pads 317 of the third sub-chip 310 in a one-to-one manner whereby a single fourth common pad 357 overlaps with a single third common pad 317. The third common pads 317 may be bonded to the fourth common pads 357, and the third common pads 317 and the fourth common pads 357 may be electrically connected to each other to provide signal paths. The third common pads 317 of the third sub-chip 310 may be data input/output (I/O) terminals of the third sub-chip 310. The fourth common pads 357 of the fourth sub-chip 350 may be data input/output (I/O) terminals of the fourth sub-chip 350.

The third discrete pad 315 of the third sub-chip 310 may be disposed independently of a position of the fourth discrete pad 355 of the fourth sub-chip 350. The third discrete pad 315 of the third sub-chip 310 and the fourth discrete pad 355 of the fourth sub-chip 350 may be disposed to be spaced apart from each other without overlapping in a plan view. For example, the third discrete pad 315 of the third sub-chip 310 and the fourth discrete pad 355 of the fourth sub-chip 350 may be disposed to be spaced apart from each other to prevent the third and fourth discrete pads 315 and 355 from vertically overlapping each other. The third discrete pad 315 of the third sub-chip 310 may be located at one side of a region including the third common pads 317 (or the fourth common pads 357) opposite to the fourth discrete pad 355 of the fourth sub-chip 350 in a plan view. The third discrete pad 315 may be a third chip enable pad to which a chip enable signal for selectively driving the third sub-chip 310 is applied. Similarly, the fourth discrete pad 355 may be a fourth chip enable pad to which a chip enable signal for selectively driving the fourth sub-chip 350 is applied.

Figure 4:
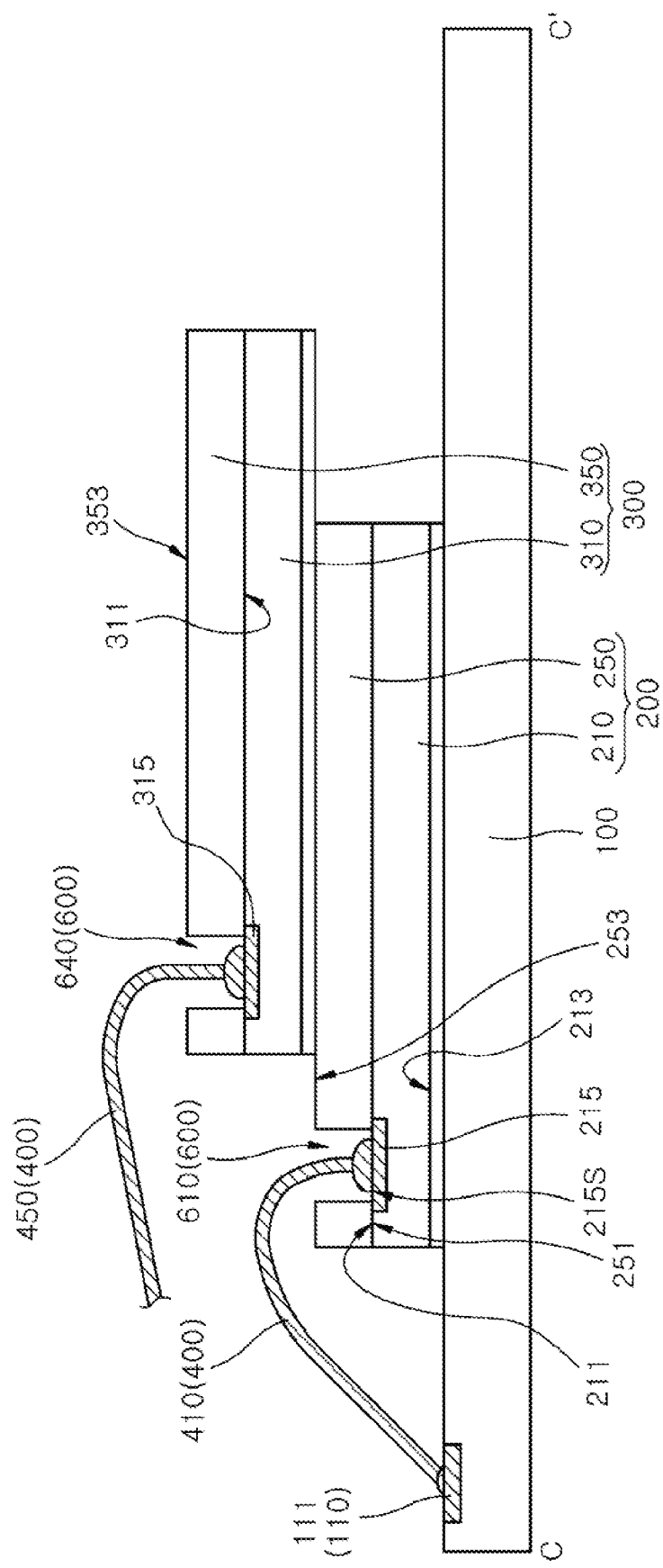
FIG. 4 is a cross-sectional view taken along a line C-C' of FIG. 1.

FIG. 4 is a cross-sectional view taken along a line C-C' of FIG. 1.

Referring to FIGS. 1 and 4, the second sub-chip 250 of the first sub-chip stack 200 may include a first through hole 610 revealing the first discrete pad 215 of the first sub-chip 210. The first through hole 610 may be disposed to penetrate the fourth surface 253 of the second sub-chip 250. The first through hole 610 may be a through hole extending from the fourth surface 253 of the second sub-chip 250 to the third surface 211 of the second sub-chip 250. The first through hole 610 may be formed to fully penetrate the second sub-chip 250 in a vertical direction.

A surface 215S of the first discrete pad 215 of the first sub-chip 210 may be revealed and exposed by the first through hole 610. One end of a first boding wire 410 included in the bonding wires 400 may be bonded to the surface 215S of the first discrete pad 215. The other end of the first boding wire 410 may be bonded to a first bonding finger 111 included in the bonding fingers 110 of the package substrate 100. The first boding wire 410 may directly connect the first discrete pad 215 of the first sub-chip 210 to the first bonding finger 111 via the first through hole 610.

Figure 5:
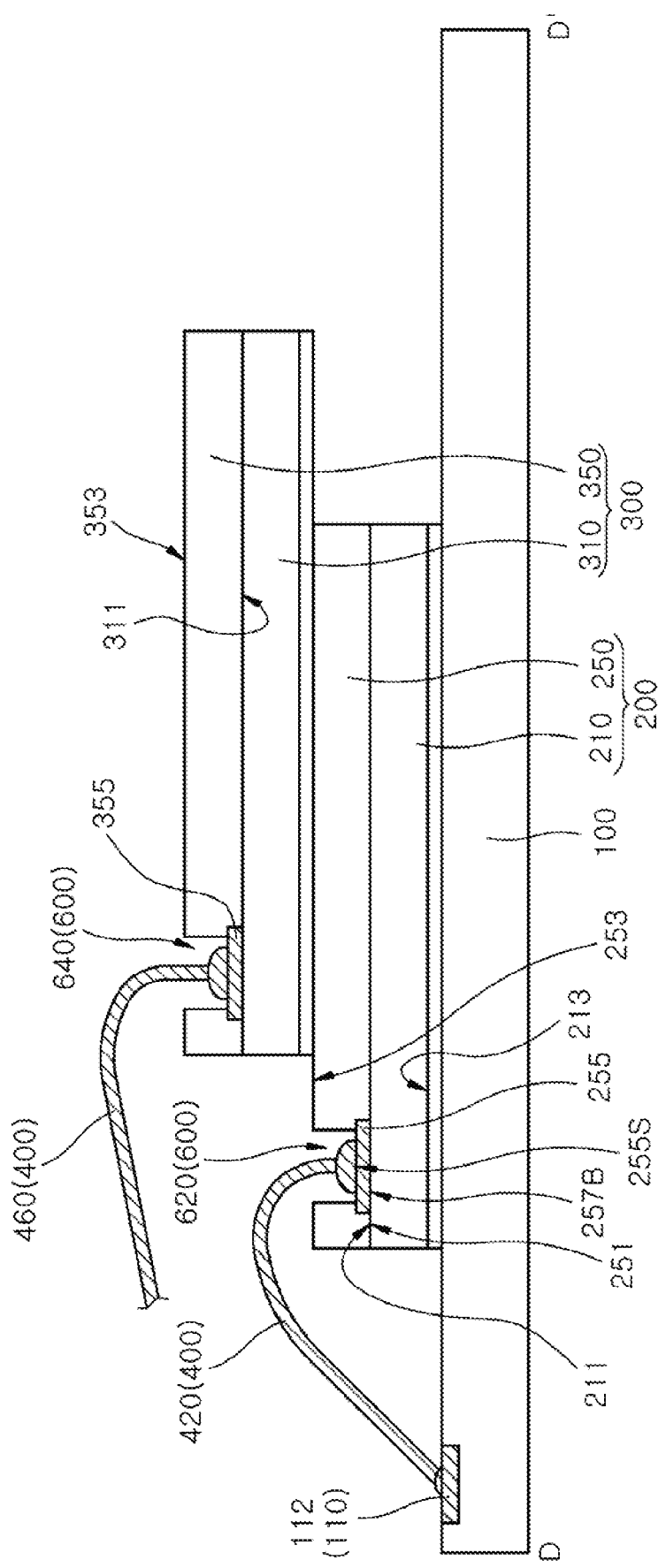
FIG. 5 is a cross-sectional view taken along a line D-D' of FIG. 1.

FIG. 5 is a cross-sectional view taken along a line D-D' of FIG. 1.

Referring to FIGS. 1 and 5, the second sub-chip 250 of the first sub-chip stack 200 may include a second through hole 620 revealing the second discrete pad 255 of the second sub-chip 250. The second through hole 620 may be disposed to penetrate the fourth surface 253 of the second sub-chip 250. The second through hole 620 may be a through hole extending from the fourth surface 253 of the second sub-chip 250 to a surface 255S of the second discrete pad 255. That is, the surface 255S of the second discrete pad 255 of the second sub-chip 250 may be revealed and exposed by the second through hole 620. The surface 255S of the second discrete pad 255 revealed by the second through hole 620 may correspond to a backside surface of the second discrete pad 255 which is opposite to the first sub-chip 210. The second through hole 620 may substantially penetrate the second sub-chip 250 to expose the backside surface 255S of the second discrete pad 255.

One end of a second boding wire 420 included in the bonding wires 400 may be bonded to the surface 255S of the second discrete pad 255. The other end of the second boding wire 420 may be bonded to a second bonding finger 112 included in the bonding fingers 110 of the package substrate 100. The second boding wire 420 may directly connect the second discrete pad 255 of the second sub-chip 250 to the second bonding finger 112 via the second through hole 620.

Figure 6:
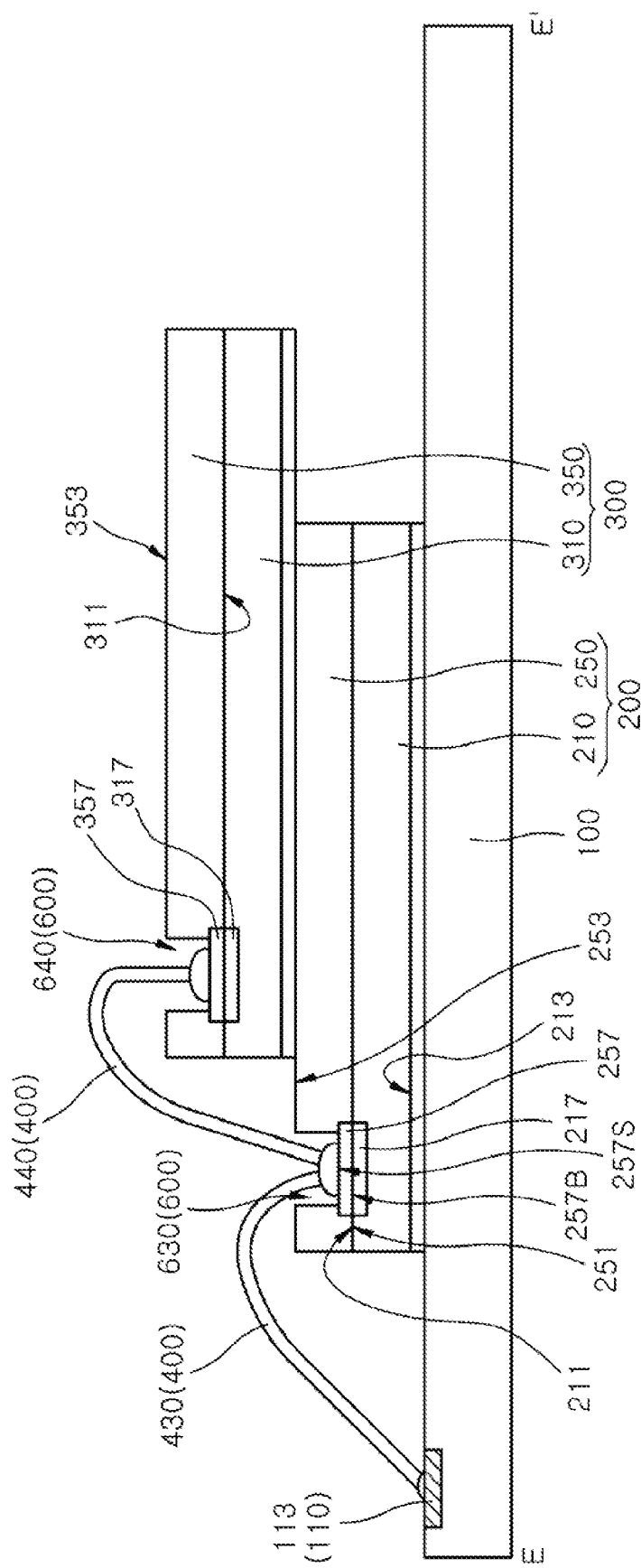
FIG. 6 is a cross-sectional view taken along a line E-E' of FIG. 1.

FIG. 6 is a cross-sectional view taken along a line E-E' of FIG. 1.

Referring to FIGS. 1 and 6, the second sub-chip 250 of the first sub-chip stack 200 may include third through holes 630 revealing the second common pads 257 of the second sub-chip 250. The third through holes 630 may be disposed to penetrate the fourth surface 253 of the second sub-chip 250. The third through holes 630 may be through holes extending from the fourth surface 253 of the second sub-chip 250 to surfaces 257S of the second common pads 257. That is, the surfaces 257S of the second common pads 257 of the second sub-chip 250 may be revealed and exposed by respective ones of the third through holes 630. The surfaces 257S of the second common pads 257 revealed by the third through holes 630 may correspond to backside surfaces of the second common pads 257 opposite to the first common pads 217. Bonded surfaces 257B between the first common pads 217 and the second common pads 257 may correspond to front side surfaces of the second common pads 257. The third through holes 630 may substantially penetrate the second sub-chip 250 to expose respective ones of the backside surfaces 257S of the second common pads 257.

First ends of third boding wires 430 included in the bonding wires 400 may be bonded to the surfaces 257S of the second common pads 257. Second ends of the third boding wires 420 opposite to the first ends may be bonded to third bonding fingers 113 included in the bonding fingers 110 of the package substrate 100. The third boding wires 430 may directly connect the second common pads 257 of the second sub-chip 250 to the third bonding finger 113 via the third through holes 630.

Because the first common pads 217 are bonded to the second common pads 257, the first common pads 217 may be electrically connected to the third bonding wires 430 through the second common pads 257. The first sub-chip 210 may be electrically connected to the third bonding fingers 113 of the package substrate 100 through the first common pads 217, the second common pads 257 and the third bonding wires 430. The second sub-chip 250 may be electrically connected to the third bonding fingers 113 of the package substrate 100 through the second common pads 257 and the third bonding wires 430.

The first common pads 217 and the second common pads 257 may be electrically connected to the third bonding fingers 113 by the third bonding wires 430. That is, both of the first and second sub-chips 210 and 250 may be electrically connected to the third bonding fingers 113 through the first common pads 217, the second common pads 257 and the third bonding wires 430. However, as illustrated in FIG. 4, the first sub-chip 210 may be selected and may be selectively enabled if a chip enable signal is applied to the first bonding wire 410 and the first discrete pad 215. In addition, as illustrated in FIG. 5, the second sub-chip 250 may be selected and may be selectively enabled if a chip enable signal is applied to the second bonding wire 420 and the second discrete pad 255. Thus, it may be possible to select one of the first and second sub-chips 210 and 250 and to apply data or signals to the selected sub-chip through the third bonding fingers 113, the third bonding wires 430, the first common pads 217 and the second common pads 257.

Referring to FIGS. 2 and 6, the first through holes 610 of the second sub-chip 250 may have a depth D1 which is greater than a depth D3 of the third through holes 630. Whereas a top surface of the first discrete pad 215 revealed by the first through hole 610 is located at the same level as the first surface 211 of the first sub-chip 210, the second common pads 257 revealed by the third through holes 630 are located on the first common pads 217. Because the first discrete pad 215 and the first common pads 217 are located at the same level, the second common pads 257 may be located at a level which is higher than the first discrete pad 215. Thus, the depth D1 of the first through hole 610 may be greater than the depth D3 of the third through holes 630 by a thickness of the second common pads 257. The second through hole 620 may have a depth D2 which is substantially equal to the depth D3 of the third through holes 630.

Referring again to FIGS. 1 and 2, the first to third through holes 610, 620 and 630 may be arrayed in a row or a column and may be formed in the second sub-chip 250. However, in some other embodiments, a single trench-shaped through hole may be formed in the second sub-chip 250 instead of the first to third through holes 610, 620 and 630. In such a case, the single trench-shaped through hole may be formed to reveal all of the first discrete pad 215, the second common pads 257 and the second discrete pad 255.

Referring to FIGS. 1, 3 and 4, the fourth sub-chip 350 of the second sub-chip stack 300 may include a fourth through hole 640 revealing the third discrete pad 315 of the third sub-chip 310. The fourth through hole 640 may be disposed to penetrate an eighth surface 353 of the fourth sub-chip 350 opposite to the third sub-chip 310. The fourth through hole 640 may be a through hole extending from the eighth surface 353 of the fourth sub-chip 350 to the seventh surface 351 of the fourth sub-chip 350.

Referring to FIGS. 1, 3 and 5, the fourth sub-chip 350 of the second sub-chip stack 300 may further include a fourth through hole 640 revealing the fourth discrete pad 355 of the fourth sub-chip 350. Referring to FIGS. 1, 3 and 6, the fourth sub-chip 350 of the second sub-chip stack 300 may further include other fourth through holes 640 revealing the fourth common pads 357 of the fourth sub-chip 350. As illustrated in FIG. 3, all of the fourth through holes 640 may substantially penetrate the fourth sub-chip 350 to reveal the third discrete pad 315, the fourth discrete pad 355 and the fourth common pads 357, respectively.

Referring again to FIGS. 1, 3 and 6, fourth bonding wires 440 included in the bonding wires 400 may be disposed to electrically connect the fourth common pads 357 revealed by the fourth through holes 640 to the second common pads 257. First ends of the fourth bonding wires 440 may be bonded to respective ones of the fourth common pads 357, and second ends of the fourth bonding wires 440 opposite to the first ends may be bonded to respective ones of the second common pads 257. Thus, the fourth bonding wires 440 may be electrically connected to the third bonding wires 430 through the second common pads 257. As such, the fourth bonding wires 440 may be formed to electrically connect the second sub-chip stack 300 to the third bonding wires 430. The fourth bonding wires 440 may be bonding wires that electrically connect the second sub-chip stack 300 to the first sub-chip stack 200.

Referring again to FIGS. 1, 3 and 4, a fifth bonding wire 450 included in the bonding wires 400 may be electrically connected to the third discrete pad 315 revealed by one of the fourth through holes 640. The fifth bonding wire 450 may directly connect the third discrete pad 315 of the third sub-chip 310 to a fifth bonding finger 115 included in the bonding fingers 110 of the package substrate 100 via the fourth through hole 640. A chip enable signal for selecting the third sub-chip 310 may be applied to the third sub-chip 310 through the fifth bonding finger 115, the fifth bonding wire 450 and the third discrete pad 315.

Referring again to FIGS. 1, 3 and 5, a sixth bonding wire 460 included in the bonding wires 400 may be electrically connected to the fourth discrete pad 355 revealed by one of the fourth through holes 640. The sixth bonding wire 460 may directly connect the fourth discrete pad 355 of the fourth sub-chip 350 to a sixth bonding finger 116 included in the bonding fingers 110 of the package substrate 100 via the fourth through hole 640. A chip enable signal for selecting the fourth sub-chip 350 may be applied to the fourth sub-chip 350 through the sixth bonding finger 116, the sixth bonding wire 460 and the fourth discrete pad 355.

The fifth and sixth bonding wires 450 and 460 may be bonding wires that directly connect the second sub-chip stack 300 to the package substrate 100.

Referring to FIGS. 1 and 2, the first common pads 217 of the first sub-chip stack 200 may be bonded to and may be electrically connected to the second common pads 257 of the first sub-chip stack 200. Because the third bonding wires 430 are bonded to the second common pads 257, the first and second common pads 217 and 257 may be electrically connected to the third bonding wires 430. The first and second common pads 217 and 257 may be electrically connected to the package substrate 100 by the third bonding wires 430.

As such, the first sub-chip 210 and the second sub-chip 250 may be electrically connected to the package substrate 100 by the third bonding wires 430, the first common pads 217 and the second common pads 257. Accordingly, the third bonding wires 430, the first common pads 217 and the second common pads 257 may constitute a hybrid wire bonding structure. The hybrid wire bonding structure may electrically connect the first sub-chip 210 and the second sub-chip 250 to the package substrate 100. Thus, the first sub-chip 210 and the second sub-chip 250 may be bonded to each other by a wafer bonding technique to constitute the first sub-chip stack 200, and the second sub-chip stack 300 may be stacked on the first sub-chip stack 200 to provide the stack package 10.

The first sub-chip 210 and the second sub-chip 250 constituting the first sub-chip stack 200 may be electrically connected to each other without using through silicon vias (TSVs). The hybrid wire bonding structure may electrically connect the first sub-chip 210 and the second sub-chip 250 to the package substrate 100 even without using the TSVs. Thus, according to an embodiment, some problems due to the TSVs may be overcome. For example, an embodiment may solve a low fabrication yield due to the TSVs to improve a fabrication yield of the stack packages.

The first sub-chip 210 and the second sub-chip 250 constituting the first sub-chip stack 200 may be directly bonded to each other using a wafer bonding technique. In such a case, because no adhesive layer is used to bond the first sub-chip 210 to the second sub-chip 250, a thickness of the first sub-chip stack 200 may be reduced. Thus, the number of sub-chips stacked in the stack package 10 may increase even without increasing a total thickness of the stack package 10.

Both of the first sub-chip 210 and the second sub-chip 250 may be electrically connected to the third bonding wires 430. Even though one of the first and second sub-chips 210 and 250 is a failed chip, the other one of the first and second sub-chips 210 and 250 may be used without any connection failure.

The first discrete pad 215 of the first sub-chip 210 and the second discrete pad 255 of the second sub-chip 250 may be located at two opposite sides of a region including the first and second common pads 217 and 257, respectively. Thus, the first bonding wire 410 connected to the first discrete pad 215 of the first sub-chip 210 and the second bonding wire 420 connected to the second discrete pad 255 of the second sub-chip 250 may be located at two opposite sides of a region including the third bonding wires 430. A disposition flexibility of the boding wires 400 including the first bonding wire 410 and the second bonding wire 420 separated from each other by the third bonding wires 430 may relatively increase as compared with a case that the first bonding wire and the second bonding wire are disposed to be immediately adjacent to each other. Thus, according to an embodiment, it may be possible to effectively suppress occurrence of failure that the bonding wires are deformed to contact each other while the bonding wires 400 are disposed.

FIGS. 7 to 10 are cross-sectional views illustrating a method of fabricating the first sub-chip stack 200 included in the stack package 10 of FIG. 1.

Figure 7:
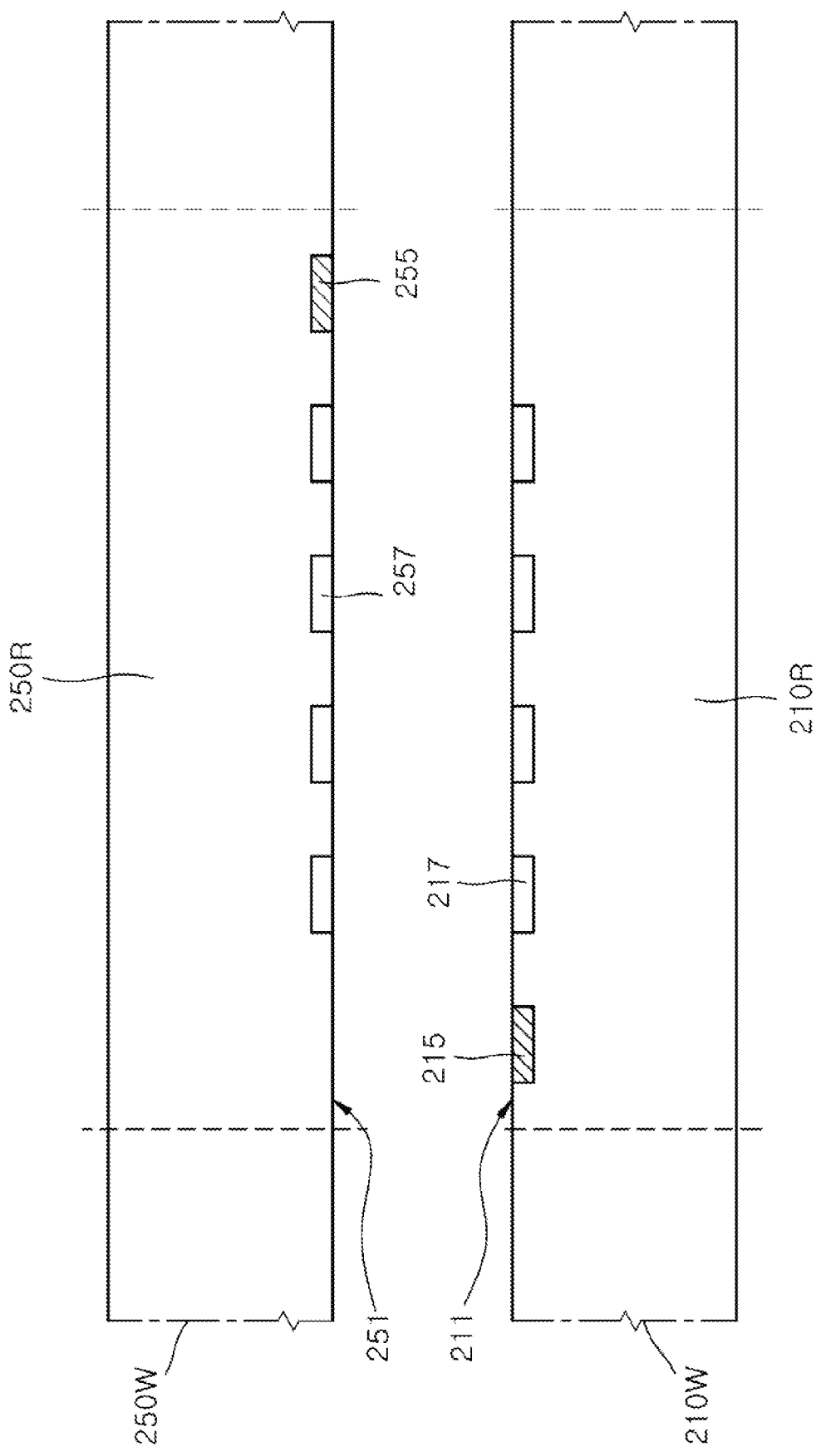
FIGS. 7 to 10 are cross-sectional views illustrating a method of fabricating a sub-chip stack according to an embodiment.

FIG. 7 illustrates a step of providing a first wafer 210W and a second wafer 250W. The first wafer 210W may be a wafer including a first sub-chip region 210R. The first wafer 210W may include a first surface 211 and a first discrete pad 215 and first common pads 217 disposed to be adjacent to the first surface 211. The second wafer 250W may be a wafer including a second sub-chip region 250R. The second wafer 250W may include a third surface 251 and a second discrete pad 255 and second common pads 257 disposed to be adjacent to the third surface 251.

Figure 8:
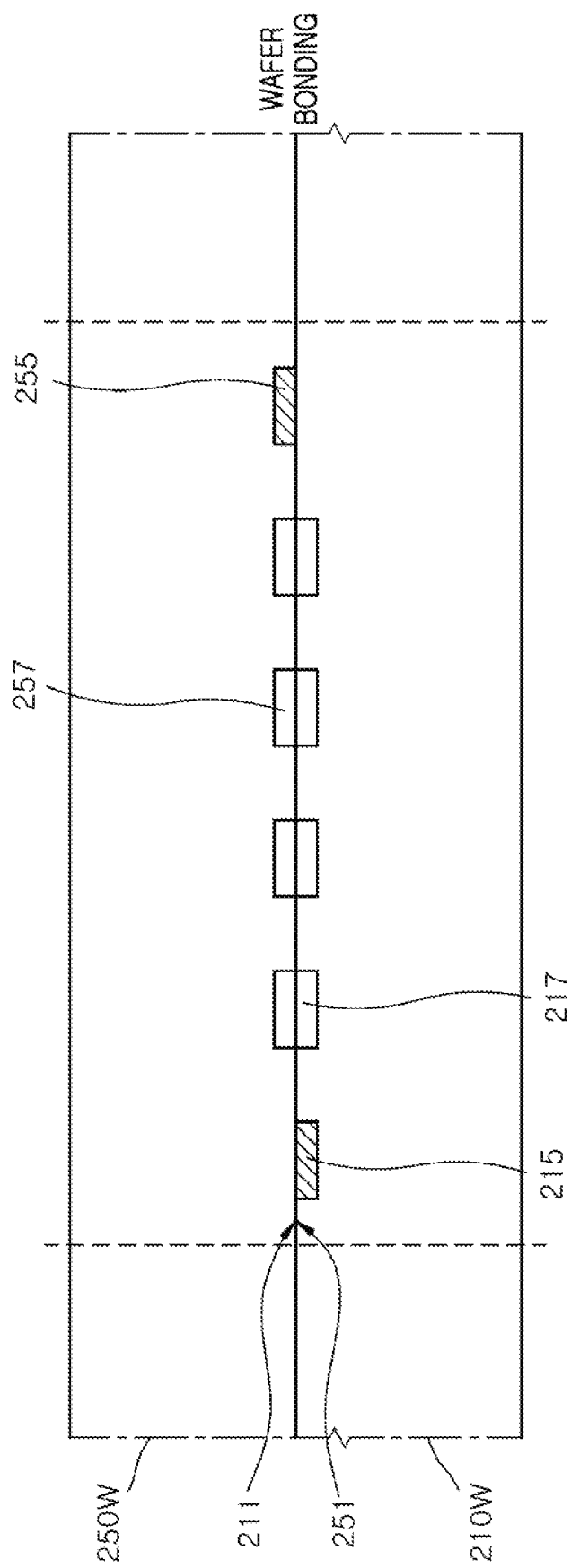

FIG. 8 illustrates a step of bonding the first and second wafers 210W and 250W to each other. The second wafer 250W may be aligned with the first wafer 210W such that the third surface 251 of the second wafer 250W faces the first surface 211 of the first wafer 210W, and the third surface 251 of the second wafer 250W may be bonded to the first surface 211 of the first wafer 210W using a wafer bonding technique. The first common pads 217 may be bonded to respective ones of the second common pads 257, the first discrete pad 215 may be bonded to the third surface 251 of the second wafer 250W, and the second discrete pad 255 may be bonded to the first surface 211 of the first wafer 210W. This wafer bonding step may be performed using a direct bonding interconnection (DBI) technique.

Figure 9:
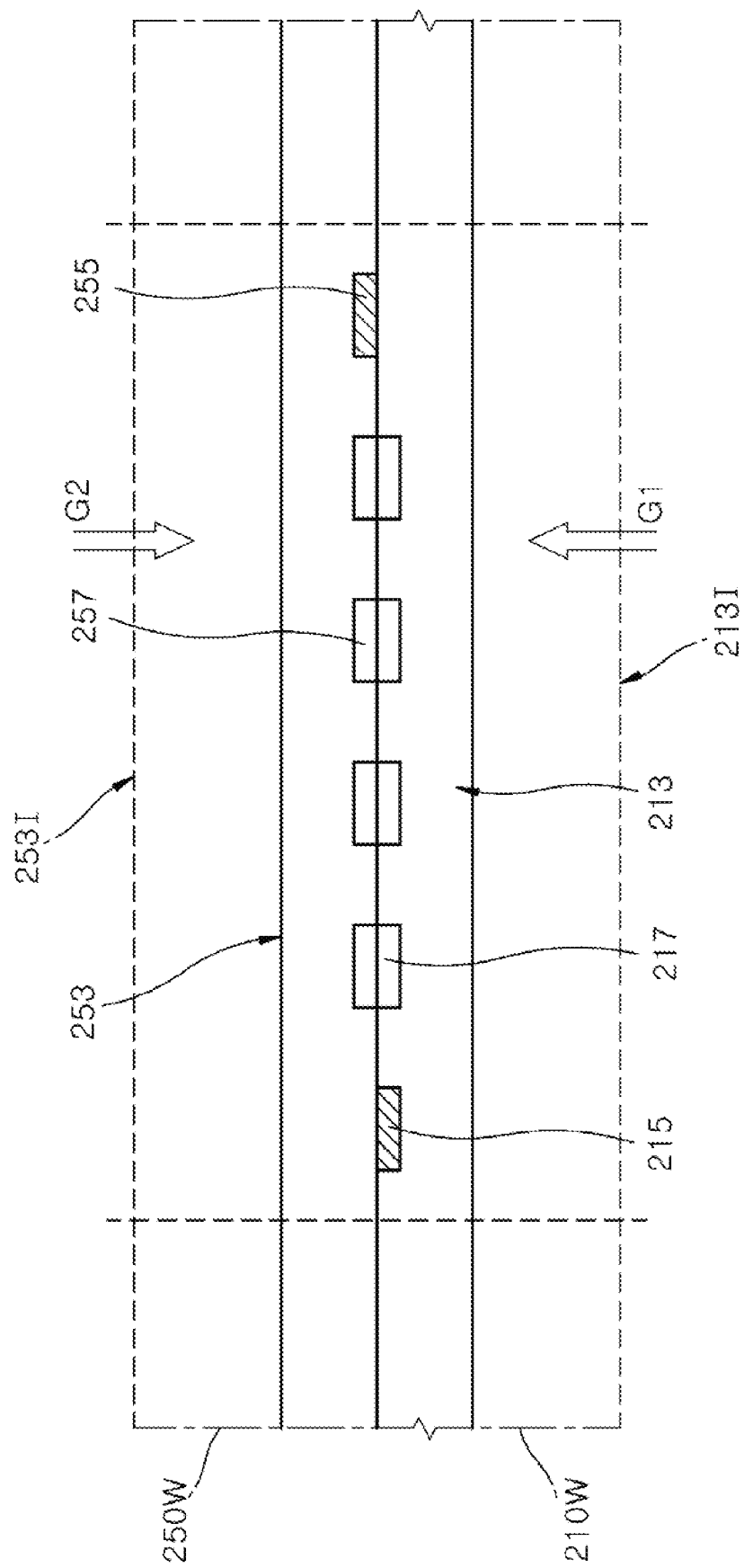

FIG. 9 illustrates a step of back-grinding the first and second wafers 210W and 250W. A first back-grinding process G1 may be applied to a first initial backside surface 2131 to reduce a thickness of the first wafer 210W. After the first back-grinding process G1, a second surface 213 corresponding to a backside surface of the back-ground first wafer may be exposed. A second back-grinding process G2 may be applied to a second initial backside surface 2531 to reduce a thickness of the second wafer 250W. After the second back-grinding process G2, a fourth surface 253 corresponding to a backside surface of the back-ground second wafer may be exposed. The first and second back-grinding processes G1 and G2 may be performed separately and independently. An amount of portion removed by the first back-grinding process G1 may be equal to or different from an amount of portion removed by the second back-grinding process G2.

Figure 10:
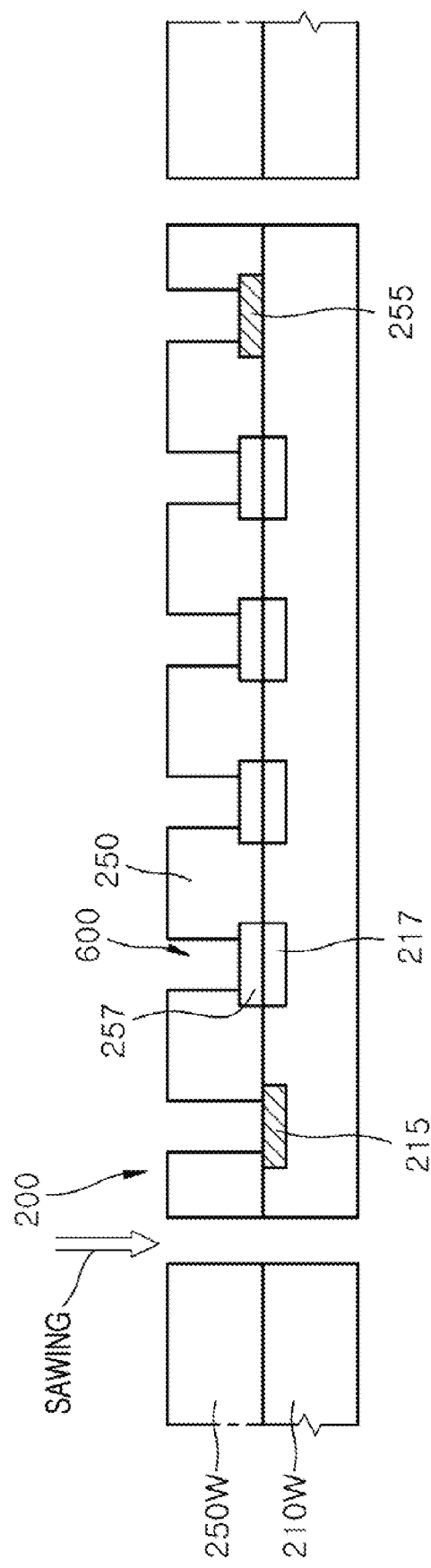

FIG. 10 illustrates a step of separating a plurality of first sub-chip stacks 200 from each other. First, through holes 600 may be formed in the bonded structure of the first and second wafers 210W and 250W to which the first and second back-grinding processes G1 and G2 are applied. The through holes 600 may be formed to substantially penetrate the second wafer 250W. Next, a separating process such as a sawing process may be applied to the bonded structure of the first and second wafers 210W and 250W to obtain the first sub-chip stacks 200 which are separated from each other. The second sub-chip stack (300 of FIG. 1) may also be obtained using substantially the same processes as described with reference to FIGS. 7 to 10.

Figure 11:
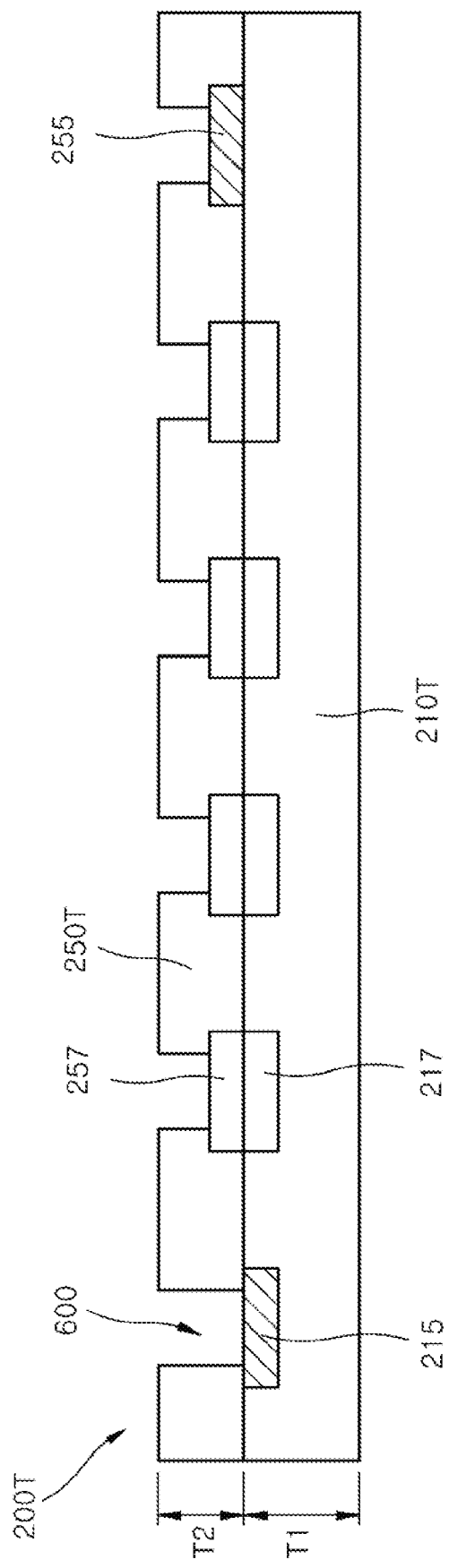
FIG. 11 is a cross-sectional view illustrating a sub-chip stack according to an embodiment.

FIG. 11 is a cross-sectional view illustrating another sub-chip stack 200T fabricated according to another embodiment.

Referring to FIG. 11, a first sub-chip 210T and a second sub-chip 250T constituting the sub-chip stack 200T may have different thicknesses. The first sub-chip 210T may have a thickness T1 which is less than a thickness T2 of the second sub-chip 250T. On the contrary, the thickness T1 of the first sub-chip 210T may greater than the thickness T2 of the second sub-chip 250T. The embodiments illustrated in FIG. 1 may be examples in which the first sub-chip 210 and the second sub-chip 250 have the same thickness.

Because the first and second sub-chips 210T and 250T are bonded to each other, it may be possible to suppress or prevent failure such as warpage of the sub-chip stack 200T from occurring even though the thickness T2 of the second sub-chip 250T is reduced. If the thickness T2 of the second sub-chip 250T is reduced, a total thickness of the sub-chip stack 200T may also be reduced. Thus, it may be possible to increase the number of sub-chips employed in a stack package having a limited height. In addition, according to the embodiments, advanced stack packages may be provided with a hybrid wire bonding structure electrically connecting a plurality of semiconductor chips to a package substrate.

Figure 12:
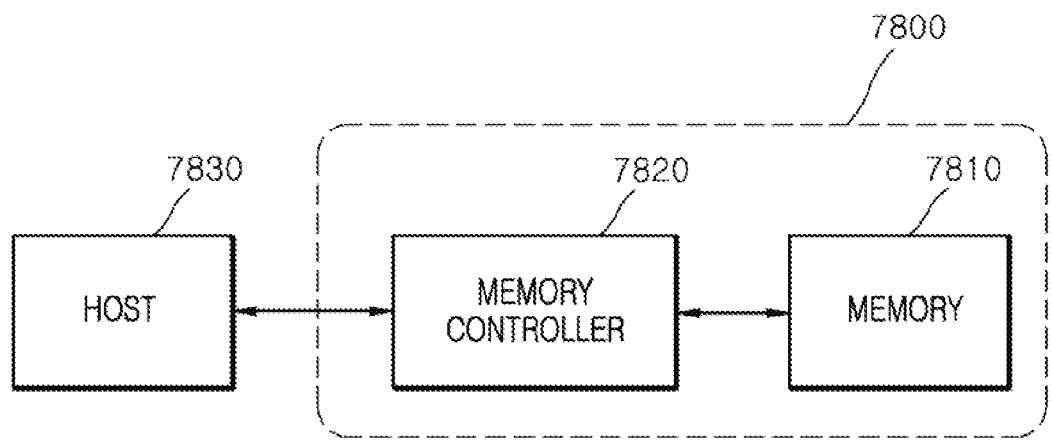
FIG. 12 is a block diagram illustrating an electronic system employing a memory card including a stack package according to an embodiment.

FIG. 12 is a block diagram illustrating an electronic system including a memory card 7800 employing at least one of the stack packages according to the embodiments. The memory card 7800 includes a memory 7810 such as a nonvolatile memory device, and a memory controller 7820. The memory 7810 and the memory controller 7820 may store data or read out the stored data. The memory 7810 and/or the memory controller 7820 may include at least one of the stack packages according to the embodiments.

The memory 7810 may include a nonvolatile memory device to which the technology of the embodiments of the present disclosure is applied. The memory controller 7820 may control the is memory 7810 such that stored data is read out or data is stored in response to a read/write request from a host 7830.

Figure 13:
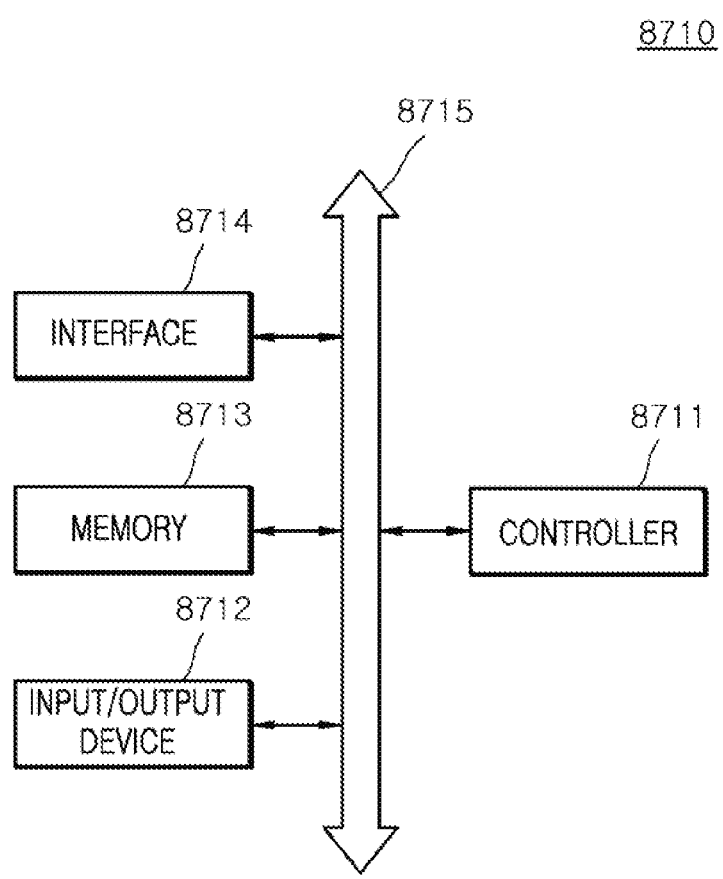
FIG. 13 is a block diagram illustrating another electronic system including a stack package according to an embodiment.

FIG. 13 is a block diagram illustrating an electronic system 8710 including at least one of the stack packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the stack packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A stack package comprising:
   a first sub-chip stack disposed on a package substrate;
   a second sub-chip stack stacked on the first sub-chip stack to be laterally offset relative to the first sub-chip stack; and
   bonding wires electrically connecting the first sub-chip stack to the package substrate,
   wherein the first sub-chip stack comprises:
      a first sub-chip having a first surface on which a first discrete pad and a first common pad are disposed; and
      a second sub-chip having a third surface bonded to the first surface,
   wherein the second sub-chip incudes:
      a second discrete pad and a second common pad disposed on the third surface; and
      through holes extending from a fourth surface of the second sub-chip opposite to the first sub-chip to reveal the first discrete pad, the second discrete pad and the second common pad,
   wherein the second common pad is bonded to the first common pad, and
   wherein each of the bonding wires passes through each of the through holes and is directly bonded to each of the first discrete pad, the second discrete pad and the second common pad.

2. The stack package of claim 1, wherein the second sub-chip fully overlaps with the first sub-chip and is bonded to the first sub-chip.

3. The stack package of claim 1, wherein the first discrete pad is disposed to be spaced apart from the second discrete pad to prevent the first discrete pad from vertically overlapping with the second discrete pad.

4. The stack package of claim 1, wherein the first discrete pad and the second discrete pad are located at two opposite sides of the first common pad, respectively.

5. The stack package of claim 1, wherein the first common pad is disposed to overlap with the second common pad.

6. The stack package of claim 1,
   wherein the through holes extend from the fourth surface of the second sub-chip to the third surface of the second sub-chip; and
   wherein the through holes comprises:
      a first through hole revealing the first discrete pad of the first sub-chip;
      a second through hole penetrating the second sub-chip to reveal the second discrete pad; and
      a third through hole penetrating the second sub-chip to reveal a backside surface of the second common pad opposite to first common pad.

7. The stack package of claim 6, wherein the first through hole is deeper than the third through hole.

8. The stack package of claim 6, wherein the bonding wires comprise:
   a first bonding wire configured to be bonded to the first discrete pad via the first through hole and configured to electrically connect the first discrete pad to a first bonding finger of the package substrate;
   a second bonding wire configured to be bonded to the second discrete pad via the second through hole and configured to electrically connect the second discrete pad to a second bonding finger of the package substrate; and
   a third bonding wire configured to be bonded to the second common pad via the third through hole and configured to electrically connect the first and second common pads to a third bonding finger of the package substrate.

9. The stack package of claim 8, further comprising a fourth bonding wire having one end which is bonded to the second common pad to be electrically connected to the third bonding wire and the other end which is electrically connected to the second sub-chip stack.

10. The stack package of claim 1, further comprising a fifth bonding wire directly connecting the second sub-chip stack to the package substrate.

11. The stack package of claim 1, wherein the first sub-chip and the second sub-chip have different thicknesses.

12. The stack package of claim 1, wherein the second sub-chip has a thickness which is less than a thickness of the first sub-chip.

13. The stack package of claim 1, wherein the second sub-chip stack has substantially the same shape as the first sub-chip stack.

14. The stack package of claim 1, wherein the second sub-chip stack comprises:
   a third sub-chip having a fifth surface on which a third discrete pad and a third common pad are disposed; and
   a fourth sub-chip having a seventh surface bonded to the fifth surface,
   wherein the fourth sub-chip comprises:
      a fourth discrete pad and a fourth common pad disposed on the seventh surface; and
      fourth through holes extending from an eighth surface of the fourth sub-chip opposite to the third sub-chip to reveal the third discrete pad, the fourth discrete pad and the fourth common pad.

15. The stack package of claim 1, further comprising an adhesive layer attaching the second sub-chip to the first sub-chip.

\* \* \* \* \*